(12) United States Patent
Chainer et al.

(10) Patent No.: US 8,687,364 B2
(45) Date of Patent: Apr. 1, 2014

(54) DIRECTLY CONNECTED HEAT EXCHANGER TUBE SECTION AND COOLANT-COOLED STRUCTURE

(75) Inventors: Timothy J. Chainer, Putnam Valley, NY (US); Patrick A. Coico, Fishkill, NY (US); David P. Graybill, Staatsburg, NY (US); Madhusudan K. Iyengar, Woodstock, NY (US); Vinod Kamath, Raleigh, NC (US); Bejoy J. Kochuparambil, Apex, NC (US); Roger R. Schmidt, Poughkeepsie, NY (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 13/283,933

(22) Filed: Oct. 28, 2011

(65) Prior Publication Data

US 2013/0107453 A1    May 2, 2013

(51) Int. Cl.
    *H05K 7/20*    (2006.01)
(52) U.S. Cl.
    USPC ........... 361/694; 361/689; 361/690; 361/699; 361/701; 165/80.3; 165/80.4; 165/104.33
(58) Field of Classification Search
    None
    See application file for complete search history.

(56) References Cited

U.S. PATENT DOCUMENTS

| | | | |
|---|---|---|---|
| 3,807,493 A | 4/1974 | Stewart | |
| 5,168,921 A | 12/1992 | Meyer | |
| 5,414,591 A | 5/1995 | Kimura et al. | |
| 5,794,454 A | 8/1998 | Harris et al. | |
| 6,263,959 B1 | 7/2001 | Ikeda et al. | |
| 6,411,512 B1 | 6/2002 | Mankaruse et al. | |

(Continued)

FOREIGN PATENT DOCUMENTS

| | | |
|---|---|---|
| CN | 201222836 Y | 4/2009 |
| EP | 2 357 878 A2 | 1/2011 |

(Continued)

OTHER PUBLICATIONS

IBM Technical Disclosure, "Highly-Efficient Copper Rail Design for Optimized Cooling of DRAM Modules", IPCOM000184053D (Jun. 9, 2009).

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

A cooling apparatus for an electronics rack is provided which includes an air-to-liquid heat exchanger, one or more coolant-cooled structures and a tube. The heat exchanger, which is associated with the electronics rack and disposed to cool air passing through the rack, includes a plurality of distinct, coolant-carrying tube sections, each tube section having a coolant inlet and a coolant outlet, one of which is coupled in fluid communication with a coolant loop to facilitate flow of coolant through the tube section. The coolant-cooled structure(s) is in thermal contact with an electronic component(s) of the rack, and facilitates transfer of heat from the component(s) to the coolant. The tube connects in fluid communication one coolant-cooled structure and the other of the coolant inlet or outlet of the one tube section, and facilitates flow of coolant directly between that coolant-carrying tube section of the heat exchanger and the coolant-cooled structure.

18 Claims, 13 Drawing Sheets

(56) References Cited

U.S. PATENT DOCUMENTS

| | | |
|---|---|---|
| 6,434,000 B1 | 8/2002 | Pandolfi et al. |
| 6,462,949 B1 | 10/2002 | Parish et al. |
| 6,480,014 B1 | 11/2002 | Li et al. |
| 6,548,894 B2 | 4/2003 | Chu et al. |
| 6,557,354 B1 | 5/2003 | Chu et al. |
| 6,775,137 B2 | 8/2004 | Chu et al. |
| 6,924,981 B2 | 8/2005 | Chu et al. |
| 6,934,118 B2 | 8/2005 | Hidaka et al. |
| 7,002,799 B2 | 2/2006 | Malone et al. |
| 7,042,726 B2 | 5/2006 | Cader et al. |
| 7,151,668 B1 | 12/2006 | Stathakis |
| 7,233,501 B1 | 6/2007 | Ingalz |
| 7,273,090 B2 | 9/2007 | Crocker et al. |
| 7,286,355 B2 | 10/2007 | Cheon |
| 7,365,985 B1 | 4/2008 | Ni |
| 7,385,810 B2 | 6/2008 | Chu et al. |
| 7,388,749 B1 | 6/2008 | Feroli et al. |
| 7,395,851 B2 | 7/2008 | Lee et al. |
| 7,420,804 B2 * | 9/2008 | Leija et al. ............... 361/679.48 |
| 7,436,663 B2 | 10/2008 | Matsushima et al. |
| 7,440,278 B2 | 10/2008 | Cheng |
| 7,443,672 B2 | 10/2008 | Peng et al. |
| 7,450,385 B1 | 11/2008 | Campbell et al. |
| 7,469,551 B2 | 12/2008 | Tilton et al. |
| 7,551,440 B2 * | 6/2009 | Belady et al. .................. 361/699 |
| 7,573,714 B2 | 8/2009 | Ali |
| 7,595,550 B2 | 9/2009 | Cady et al. |
| 7,626,820 B1 | 12/2009 | Konshak et al. |
| 7,660,109 B2 | 2/2010 | Iyengar et al. |
| 7,684,196 B2 | 3/2010 | Eckberg et al. |
| 7,701,714 B2 | 4/2010 | Shabany |
| 7,703,291 B2 | 4/2010 | Bushnik et al. |
| 7,746,634 B2 | 6/2010 | Hom et al. |
| 7,791,881 B2 | 9/2010 | Chou et al. |
| 7,791,882 B2 * | 9/2010 | Chu et al. ...................... 361/698 |
| 7,796,393 B2 | 9/2010 | Lengen et al. |
| 7,796,399 B2 | 9/2010 | Clayton et al. |
| 7,817,412 B2 | 10/2010 | Sullivan |
| 7,830,657 B2 | 11/2010 | Chu et al. |
| 7,855,890 B2 * | 12/2010 | Kashirajima et al. ......... 361/700 |
| 8,027,162 B2 | 9/2011 | Campbell et al. |
| 8,035,972 B2 * | 10/2011 | Ostwald et al. ............... 361/699 |
| 2001/0000880 A1 | 5/2001 | Chu et al. |
| 2005/0068728 A1 | 3/2005 | Chu et al. |
| 2006/0146497 A1 | 7/2006 | Gauche et al. |
| 2006/0250770 A1 | 11/2006 | Campbell et al. |
| 2006/0250772 A1 | 11/2006 | Salmonson et al. |
| 2007/0034356 A1 | 2/2007 | Kenny et al. |
| 2007/0263356 A1 | 11/2007 | Weber et al. |
| 2007/0291452 A1 * | 12/2007 | Gilliland et al. .............. 361/699 |
| 2008/0112075 A1 | 5/2008 | Farquhar et al. |
| 2008/0155990 A1 | 7/2008 | Gupta et al. |
| 2008/0239564 A1 | 10/2008 | Farquhar et al. |
| 2008/0259566 A1 | 10/2008 | Fried |
| 2008/0259567 A1 | 10/2008 | Campbell et al. |
| 2008/0310105 A1 | 12/2008 | Cheng |
| 2009/0002951 A1 | 1/2009 | Legen et al. |
| 2009/0080151 A1 | 3/2009 | Kalms et al. |
| 2009/0120607 A1 | 5/2009 | Cheon et al. |
| 2009/0201640 A1 | 8/2009 | Bard et al. |
| 2009/0201644 A1 | 8/2009 | Kelley et al. |
| 2009/0207567 A1 | 8/2009 | Campbell et al. |
| 2009/0219687 A1 | 9/2009 | Lin |
| 2009/0277616 A1 | 11/2009 | Cipolla et al. |
| 2009/0284924 A1 | 11/2009 | Konshak et al. |
| 2010/0025010 A1 | 2/2010 | Cipolla et al. |
| 2010/0027220 A1 | 2/2010 | Hughes et al. |
| 2010/0085712 A1 | 4/2010 | Hrehor et al. |
| 2010/0126696 A1 | 5/2010 | Novotny et al. |
| 2010/0142147 A1 | 6/2010 | Chang et al. |
| 2010/0252234 A1 | 10/2010 | Campbell et al. |
| 2010/0263855 A1 | 10/2010 | Arimilli et al. |
| 2010/0313590 A1 | 12/2010 | Campbell et al. |
| 2011/0051372 A1 | 3/2011 | Barringer et al. |
| 2011/0056674 A1 | 3/2011 | Campbell et al. |
| 2011/0069454 A1 | 3/2011 | Campbell et al. |
| 2011/0205705 A1 | 8/2011 | Graybill et al. |
| 2011/0313576 A1 * | 12/2011 | Nicewonger .................. 700/282 |
| 2012/0279233 A1 | 11/2012 | Chainer et al. |
| 2012/0279686 A1 | 11/2012 | Chainer et al. |
| 2012/0281359 A1 * | 11/2012 | Arney et al. .................. 361/701 |
| 2013/0138252 A1 | 5/2013 | Chainer et al. |
| 2013/0138253 A1 | 5/2013 | Chainer et al. |
| 2013/0174421 A1 | 7/2013 | Chainer et al. |

FOREIGN PATENT DOCUMENTS

| | | |
|---|---|---|
| JP | 01077199 A | 3/1989 |
| JP | 2010040886 A | 2/2010 |
| TW | 323643 U | 12/2007 |
| TW | 200937175 A | 9/2009 |

OTHER PUBLICATIONS

Office Action for U.S. Appl. No. 12/566,081 (U.S. Letters Patent No. 8,027,162), dated Jan. 14, 2011.

Notice of Allowance for U.S. Appl. No. 12/566,081 (U.S. Letters Patent No. 8,027,162), dated May 20, 2011.

Search Report issued by the Great Britain Intellectual Property Office (IPO) for GB Application No. 1216684.9, dated Jan. 14, 2013.

Chainer et al., Office Action for U.S. Appl. No. 13/102,195, filed May 6, 2011 (U.S. Patent Publication No. 2012/0279233 A1), dated Jul. 17, 2013 (38 pgs).

Notification of Transmittal of the International Search Report and the Written Opinion, issued for PCT Application No. PCT/EP2012/068516, dated Mar. 26, 2013 (10 pages).

* cited by examiner

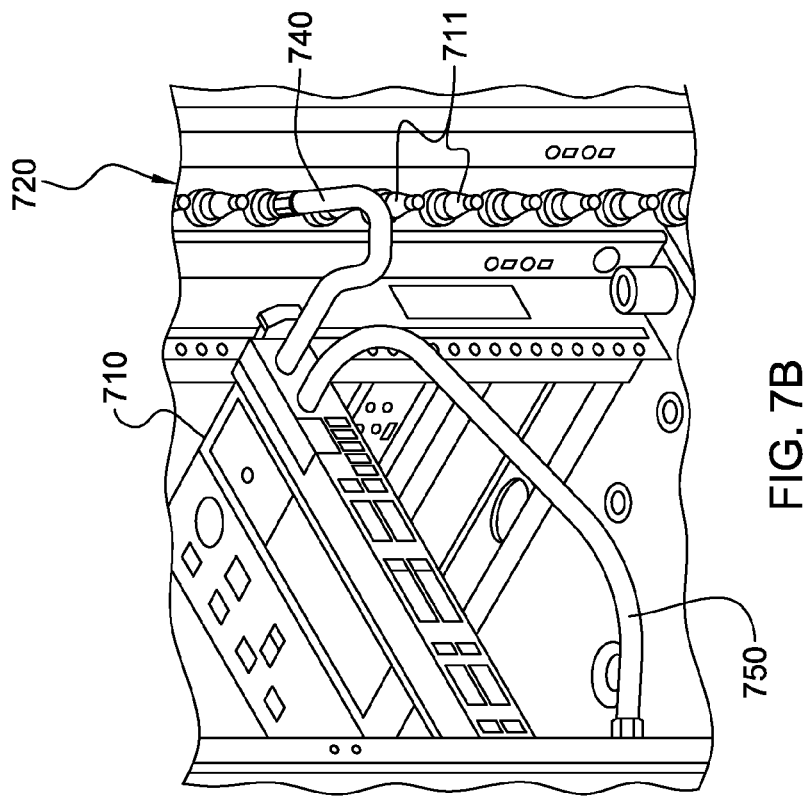
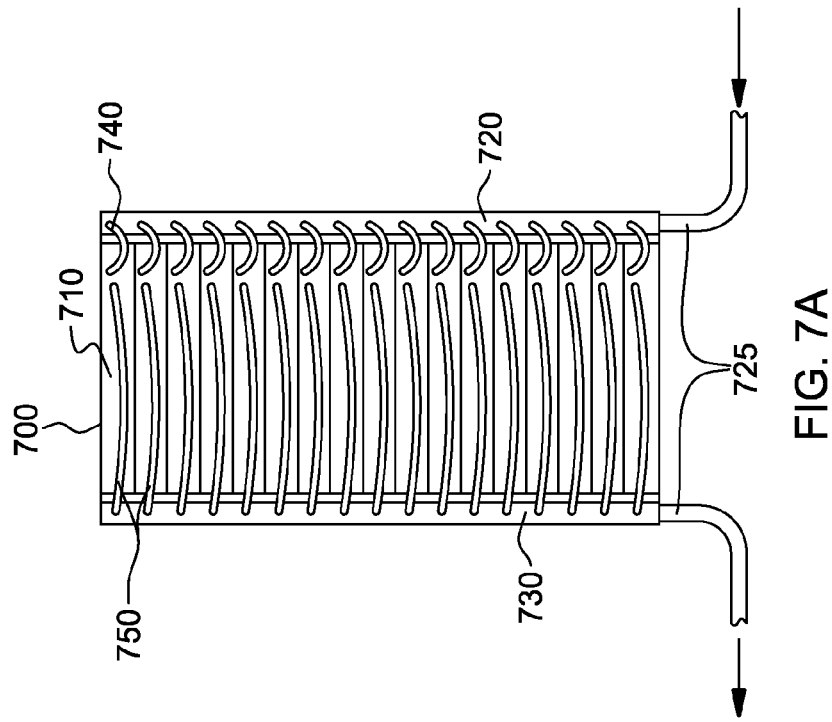
FIG. 7B
FIG. 7A

DIRECTLY CONNECTED HEAT EXCHANGER TUBE SECTION AND COOLANT-COOLED STRUCTURE

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

In one aspect, the shortcomings of the prior art are overcome and additional advantages are provided through the provision of a cooling apparatus for an electronics rack. The cooling apparatus includes an air-to-liquid heat exchanger, at least one coolant-cooled structure, and a tube connecting in fluid communication one coolant-cooled structure of the at least one coolant-cooled structure and one coolant-carrying tube section of the air-to-liquid heat exchanger. The air-to-liquid heat exchanger is associated with the electronics rack and disposed to cool at least a portion of air passing through the electronics rack, wherein air moves through the electronics rack from an air inlet side to an air outlet side thereof, and the air-to-liquid heat exchanger comprises a plurality of distinct, coolant-carrying tube sections. Each coolant-carrying tube section of the plurality of distinct, coolant-carrying tube sections has a coolant inlet and a coolant outlet. One of the coolant inlet or the coolant outlet is coupled in fluid communication with a coolant loop to facilitate flow of coolant through the coolant-carrying tube section. The at least one coolant-cooled structure is in thermal contact with at least one electronic component of the electronics rack, and the at least one coolant-cooled structure facilitates transfer of heat from the at least one electronic component to the coolant. The tube connects in fluid communication the one coolant-cooled structure of the at least one coolant-cooled structure and the other of the coolant inlet or the coolant outlet of the one coolant-carrying tube section of the plurality of distinct, coolant-carrying tube sections of the air-to-liquid heat exchanger. The tube facilitates flow of coolant directly between the one coolant-carrying tube section of the air-to-liquid heat exchanger and the one coolant-cooled structure of the at least one coolant-cooled structure.

In another aspect, a cooled electronic system is provided which includes an electronics rack and a cooling apparatus for facilitating cooling of the electronics rack. The electronics rack includes an air inlet side and an air outlet side for respectively enabling ingress and egress of air through the electronics rack, and at least one electronic component to be cooled. The cooling apparatus includes an air-to-liquid heat exchanger, at least one coolant-cooled structure, and a tube connecting in fluid communication one coolant-cooled structure of the at least one coolant-cooled structure and one coolant-carrying tube section of the air-to-liquid heat exchanger. The air-to-liquid heat exchanger is associated with the electronics rack and disposed to cool at least a portion of the air passing through the electronics rack. Each coolant-carrying tube section of a plurality of distinct, coolant-carrying tube sections of the air-to-liquid heat exchanger has a coolant inlet and a coolant outlet. One of the coolant inlet or the coolant outlet is coupled in fluid communication with a coolant loop to facilitate flow of coolant through the coolant-carrying tube section. The at least one coolant-cooled structure is in thermal contact with the at least one electronic component of the electronics rack, and facilitates transfer of heat from the at least one electronic component to the coolant. The tube connects in fluid communication the one coolant-cooled structure of the at least one coolant-cooled structure and the other of the coolant inlet or the coolant outlet of the one coolant-carrying tube section of the plurality of distinct, coolant-carrying tube sections of the air-to-liquid heat exchanger. The tube facilitates flow of coolant directly between the one coolant-carrying tube section of the air-to-liquid heat exchanger and the one coolant-cooled structure of the at least one coolant-cooled structure.

In a further aspect, a method of fabricating a cooling apparatus for facilitating cooling of an electronics rack is provided. The method includes: associating an air-to-liquid heat exchanger with the electronics rack and disposing the air-to-liquid heat exchanger to cool at least a portion of air passing through the electronics rack, wherein air moves through the electronics rack from an air inlet side to an air outlet side thereof, and the air-to-liquid heat exchanger comprises a plurality of distinct, coolant-carrying tube sections, each coolant-carrying tube section of the plurality of distinct, coolant-carrying tube sections comprising a coolant inlet and a coolant outlet, one of the coolant inlet or the coolant outlet being coupled in fluid communication with a coolant loop to facilitate flow of coolant through the coolant-carrying tube section; providing at least one coolant-cooled structure in thermal contact with at least one electronic component of the electronics rack, the at least one coolant-cooled structure facilitating transfer of heat from the at least one electronic component to the coolant; and providing a tube connecting in fluid communication one coolant-cooled structure of the at least one coolant-cooled structure and the other of the coolant inlet or the coolant outlet of the one coolant-carrying tube section of the plurality of distinct, coolant-carrying tube sections of the air-to-liquid heat exchanger, the tube facilitating flow of coolant directly between the one coolant-carrying tube section of the air-to-liquid heat exchanger and the one coolant-cooled structure of the at least one coolant-cooled structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a more detailed, elevational view of one embodiment of the liquid-cooled electronics rack of FIGS. 4 & 5A, and illustrating rack-level coolant distribution structures, in accordance with one or more aspects of the present invention;

FIG. 7B is a partial depiction of a more detailed embodiment of the rack-level coolant distribution structures illustrated in FIG. 7A, in accordance with one or more aspects of the present invention;

DETAILED DESCRIPTION

Figure 1:
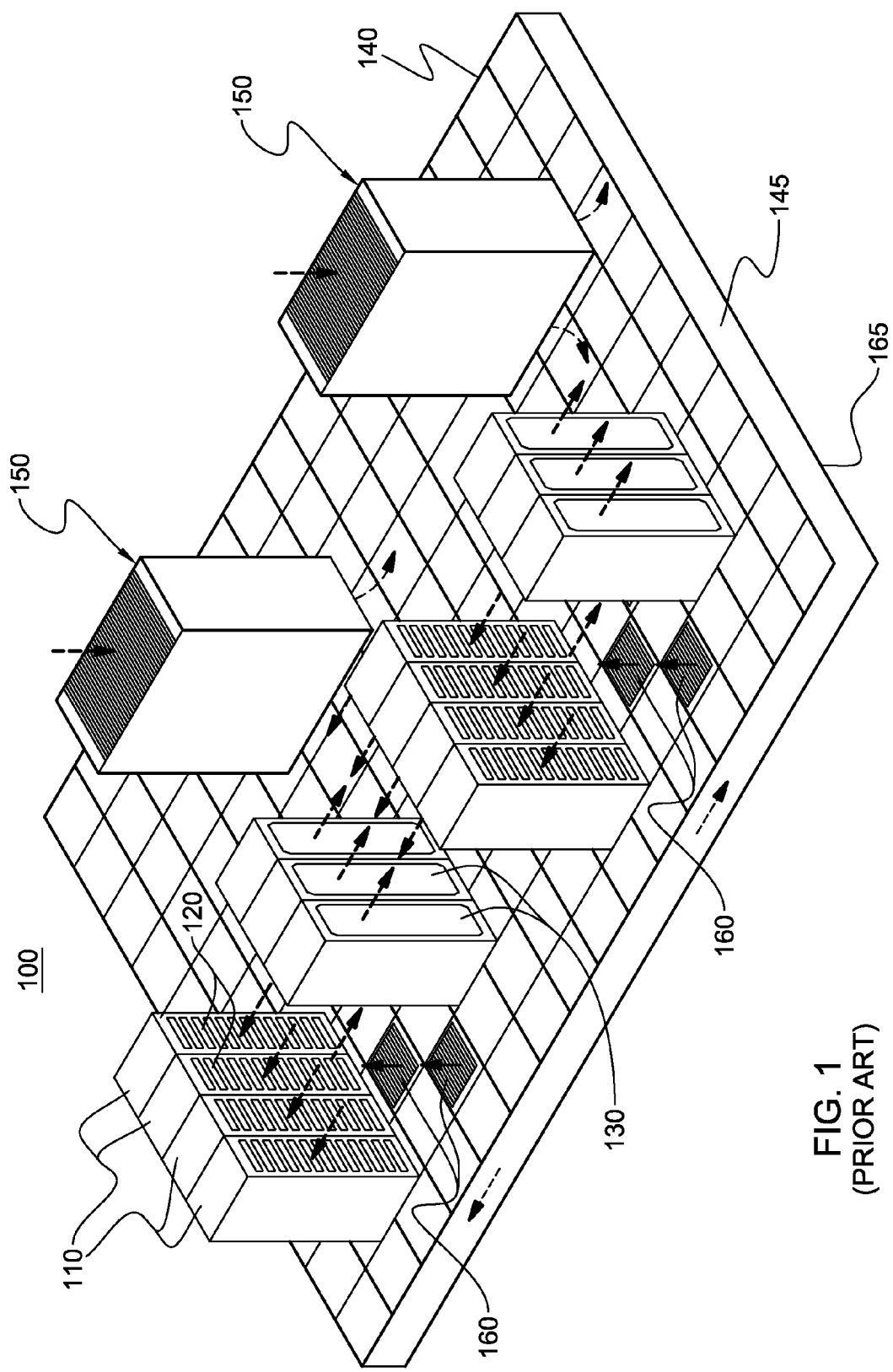
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards comprising a plurality of memory modules (such as one or more dual in-line memory modules (DIMMs)).

Further, as used herein, the terms "liquid-cooled cold plate" and "liquid-cooled cold rail" refer to thermally conductive structures having one or more channels (or passageways) formed therein or passing therethrough, which facilitate the flow of liquid coolant through the structure. A "liquid-cooled structure" may comprise, for example, one or more liquid-cooled cold plates and/or one or more liquid-cooled cold rails coupled in fluid communication and positioned in thermal contact with one or more electronic components to be cooled (for example, of an associated electronic subsystem). In one example, tubing is provided extending through or coupling in fluid communication the liquid-cooled cold plates and/or the liquid-cooled cold rails of the liquid-cooled structure.

An "air-to-liquid heat exchanger" or "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooled electronic systems disclosed herein is water. However, the concepts presented are readily adapted to use with other types of coolant. For example, the coolant may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Due to ever-increasing air flow requirements through electronics racks, and the limits of air distribution within a typical data center installation, liquid-based cooling is being combined with conventional air-cooling. FIGS. 2A-4 illustrate various embodiments of a data center implementation employing a liquid-based cooling system.

Figure 2A:
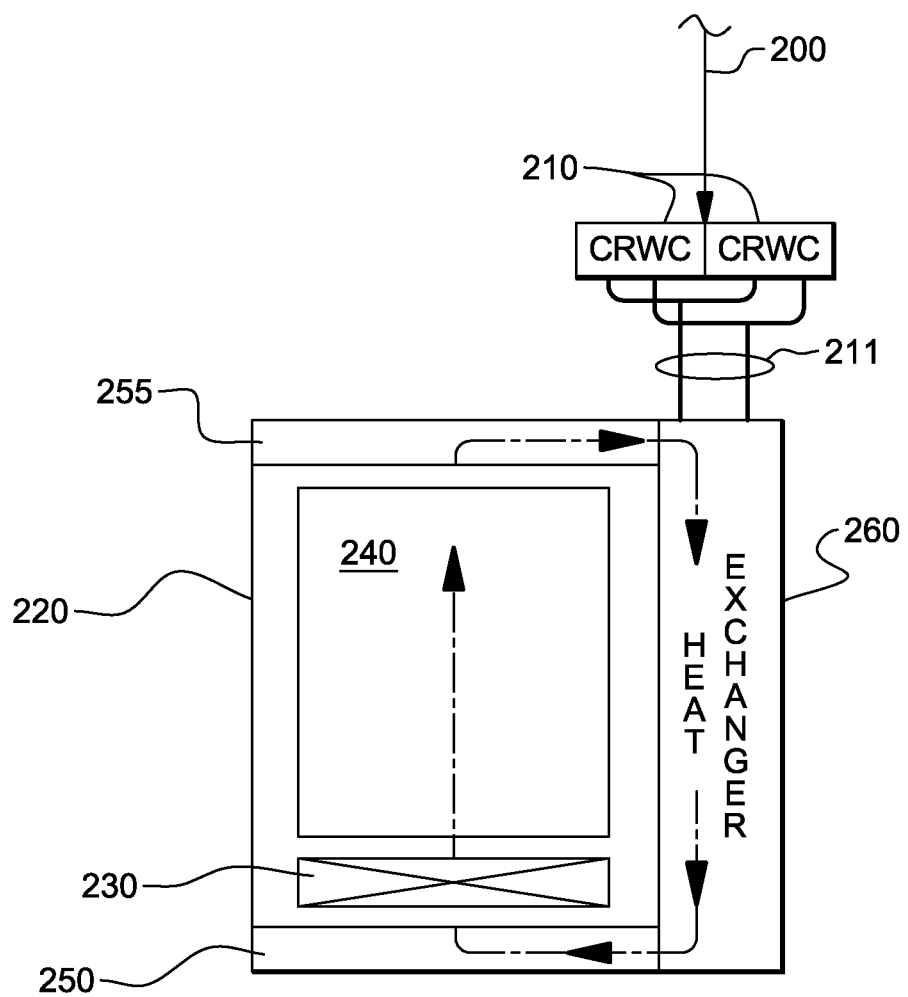
FIG. 2A is a cross-sectional plan view of one embodiment of an electronics rack with an attached air-to-liquid heat exchanger cooling air passing through the electronics rack, in accordance with one or more aspects of the present invention.

FIG. 2A depicts one rack-level liquid-cooling solution which utilizes chilled facility water to remove heat from the computer installation room, thereby transferring the cooling burden from the air-conditioning unit(s) to the building's chilled water coolers. The embodiment depicted in FIG. 2A is described in detail in commonly assigned, U.S. Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

Figure 2B:
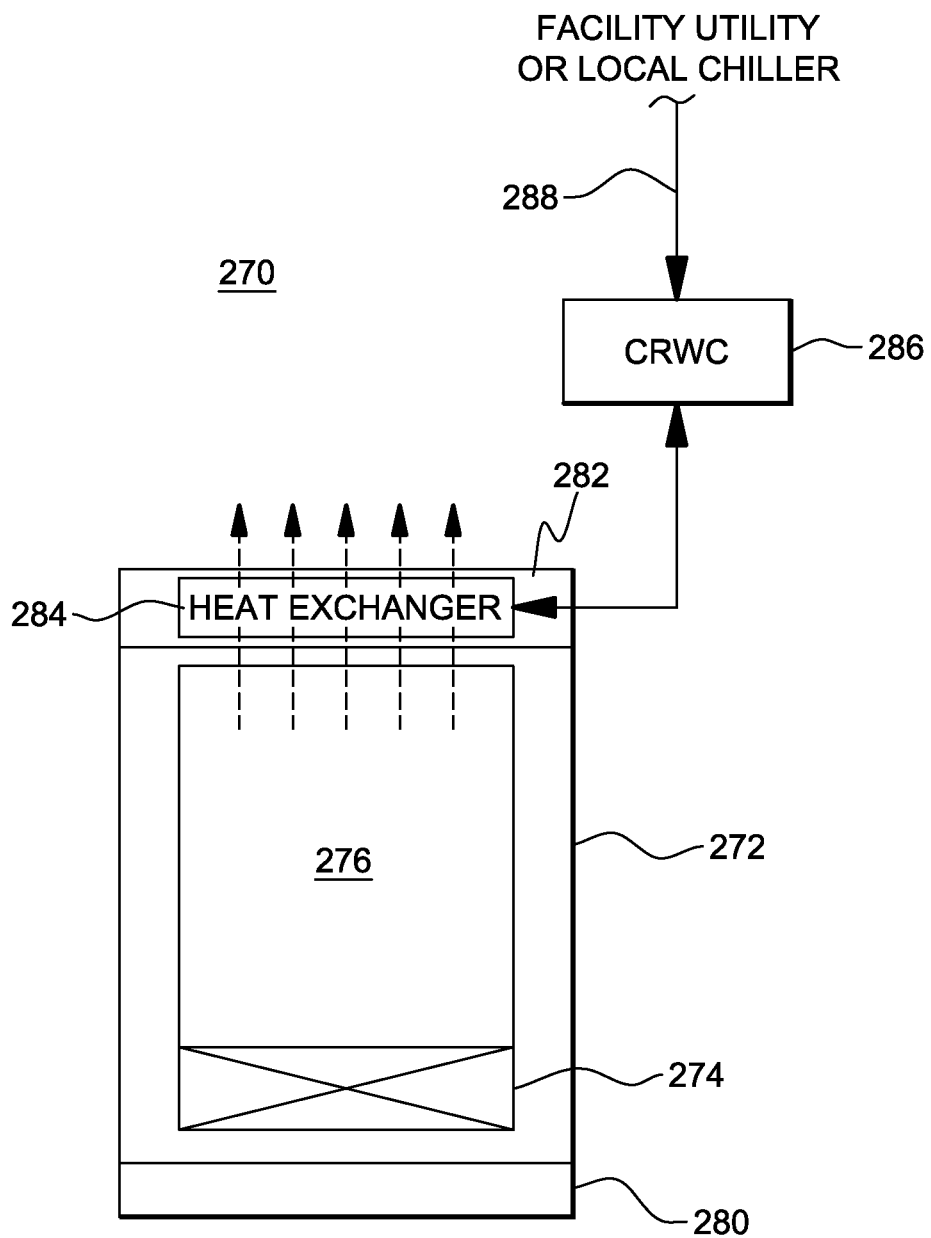
FIG. 2B is a cross-sectional plan view of another embodiment of an electronics rack with an attached air-to-liquid heat exchanger cooling air passing through the electronics rack, in accordance with one or more aspects of the present invention.

FIG. 2B illustrates another embodiment of a rack-level, liquid-cooling solution which utilizes chilled facility water to remove heat from the computer room installation, thereby transferring at least a portion of the cooling burden from the air-conditioning unit(s) to the building's chilled water coolers. This embodiment is described, for example, in U.S. Pat. No. 7,385,810 B2. Briefly summarized, due to the ever-increasing airflow requirements through electronics racks, and limits of air distribution within the typical computer room installation, recirculation problems within the room may occur. For example, hot air recirculation may occur from the air outlet side of an electronics rack back to the cold air aisle defined by, for example, opposing air inlet sides of electronics racks within the data center. This recirculation can occur because the conditioned air supplied through the tiles is typically only a fraction of the airflow rate forced through the electronics rack by the air-moving devices disposed therein. This can be due, for example, to limitations on the tile sizes (or diffuser flow rates). The remaining fraction of the supply of inlet side air is often made up by ambient room air through recirculation. This recirculation flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to maintain the temperature of the inlet air substantially uniform. The efficient cooling of such computer and electronic systems, and the amelioration of localized hot air inlet temperatures to one or more rack units due to recirculation of air currents, are addressed by the apparatuses and methods disclosed herein.

As noted, FIG. 2B depicts another embodiment of a cooled electronic system, generally denoted 270, in accordance with an aspect of the present invention. In this embodiment, electronic system 270 includes an electronics rack 272 having an inlet door 280 and an outlet door 282, which have openings to allow for the ingress and egress of external air from the inlet side to the outlet side of the electronics rack 272. The system further includes at least one air-moving device 274 for moving external air across at least one electronic subsystem 276 positioned within the electronics rack. Disposed within, for example, outlet door 282 is a heat exchange assembly 284. Heat exchange assembly 284 includes an air-to-liquid heat exchanger through which the inlet-to-outlet airflow through the electronics rack passes. A computer room water-conditioner (CRWC) 286 is used to buffer heat exchange assembly 284 from the building utility (or local chiller) coolant 288, which is provided as input to CRWC 286. The CRWC 286 provides, for example, system water (or system coolant) to heat exchange assembly 284. Heat exchange assembly 284 removes heat from the exhausting inlet-to-outlet airflow through the electronics rack for transfer via the system water (or coolant) to CRWC 286. Advantageously, providing a heat exchange assembly with an air-to-liquid heat exchanger such as disclosed herein at the outlet door cover (or at the inlet door cover) of one or more electronics racks in a computer installation can, in normal operation, significantly reduce heat loads on existing air-conditioning units within the computer installation, and facilitate the cooling of the rack-mounted electronics units.

Figure 3:
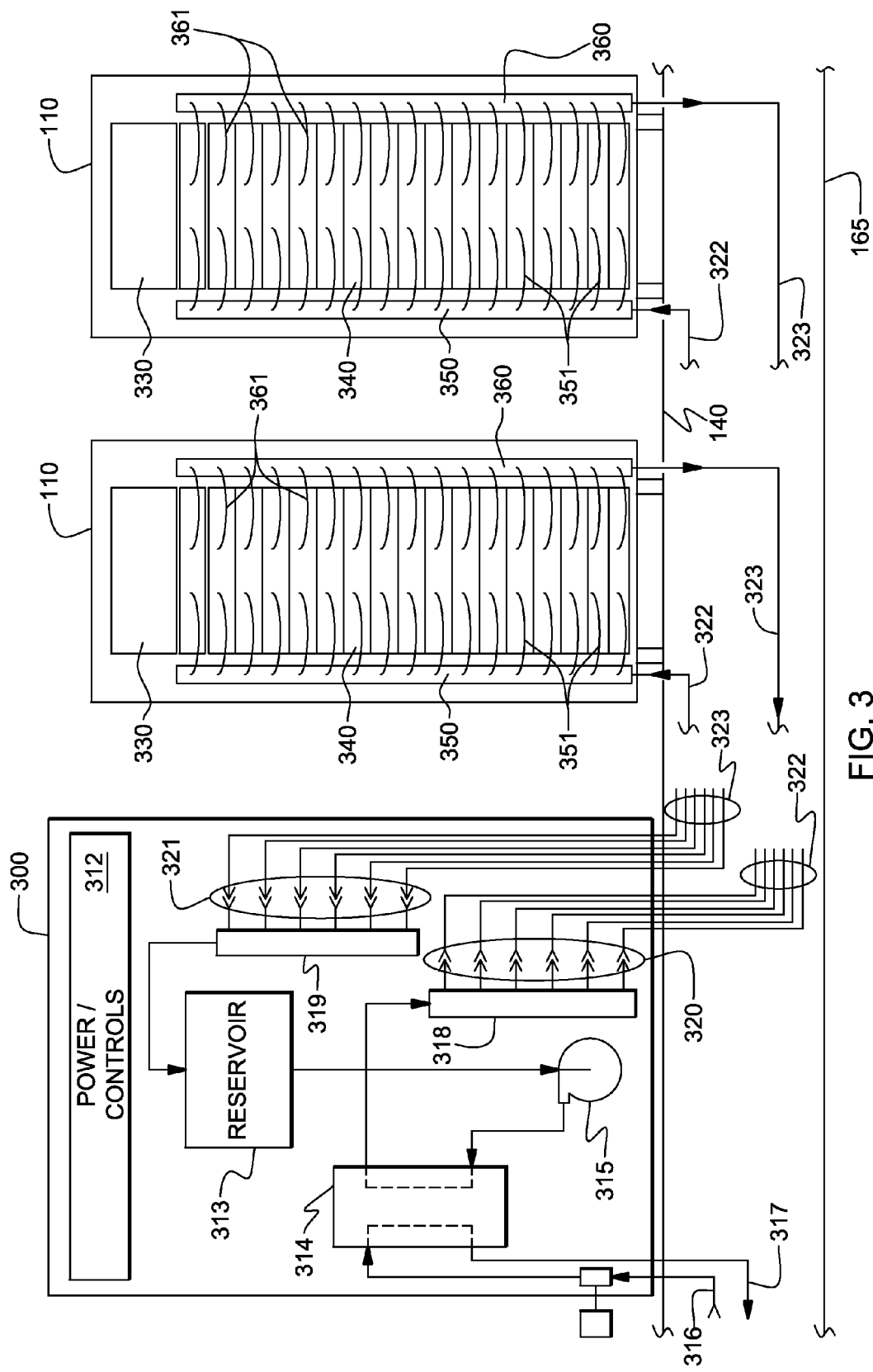
FIG. 3 depicts one embodiment of a data center with a coolant distribution unit facilitating liquid-cooling of one or more liquid-cooled electronics racks of the data center, in accordance with one or more aspects of the present invention.

FIG. 3 depicts another embodiment of a rack-level, liquid-cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

Figure 4:
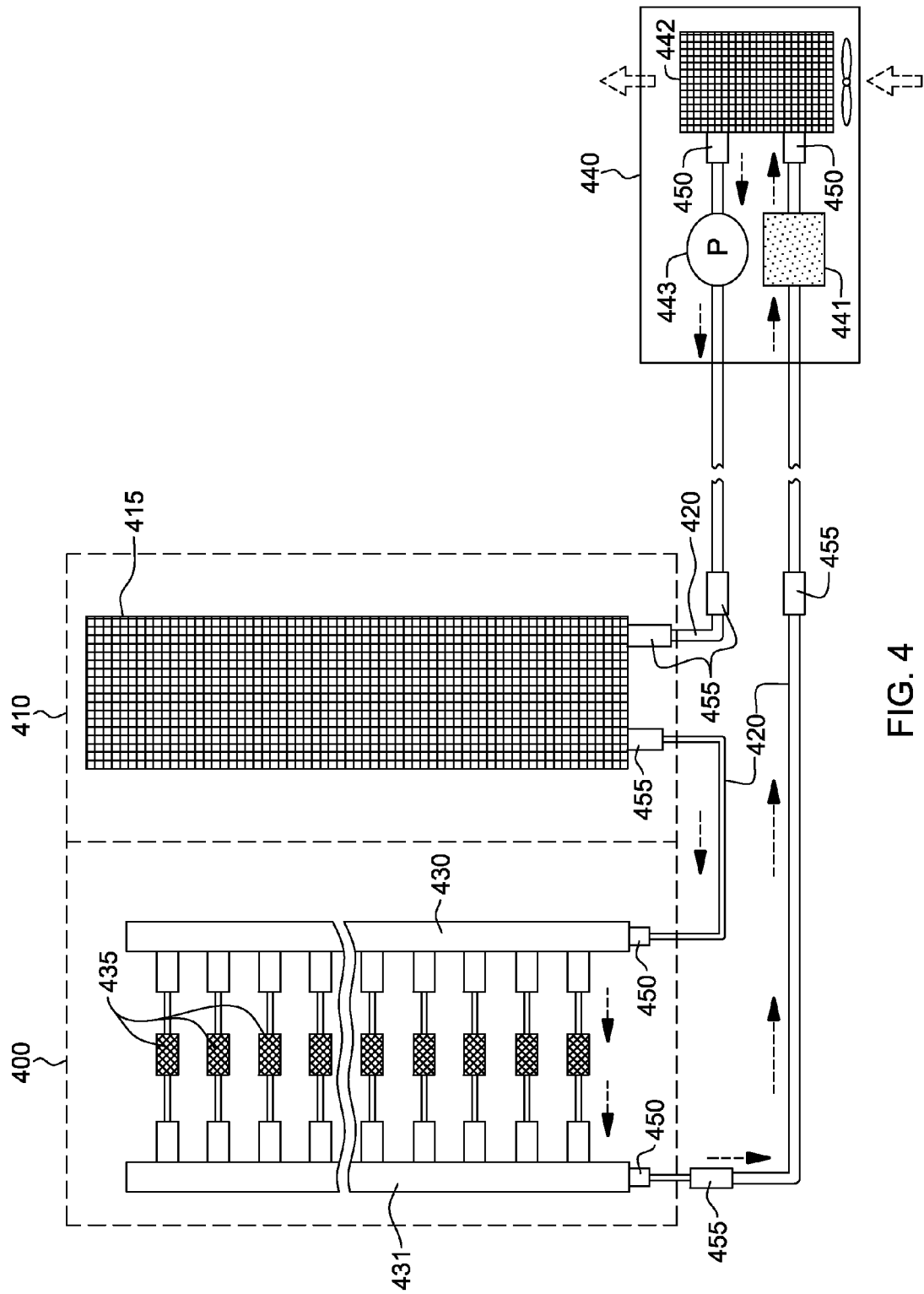
FIG. 4 depicts an alternate embodiment of a cooling apparatus and liquid-cooled electronics rack, in accordance with one or more aspects of the present invention.

FIG. 4 illustrates another embodiment of a liquid-cooled electronics rack and cooling system therefor, in accordance with one or more aspects of the present invention. In this embodiment, the electronics rack 400 has a side car structure 410 associated therewith or attached thereto, which includes an air-to-liquid heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating liquid coolant, an air-to-liquid heat exchanger 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2A & 3.

Figure 5A:
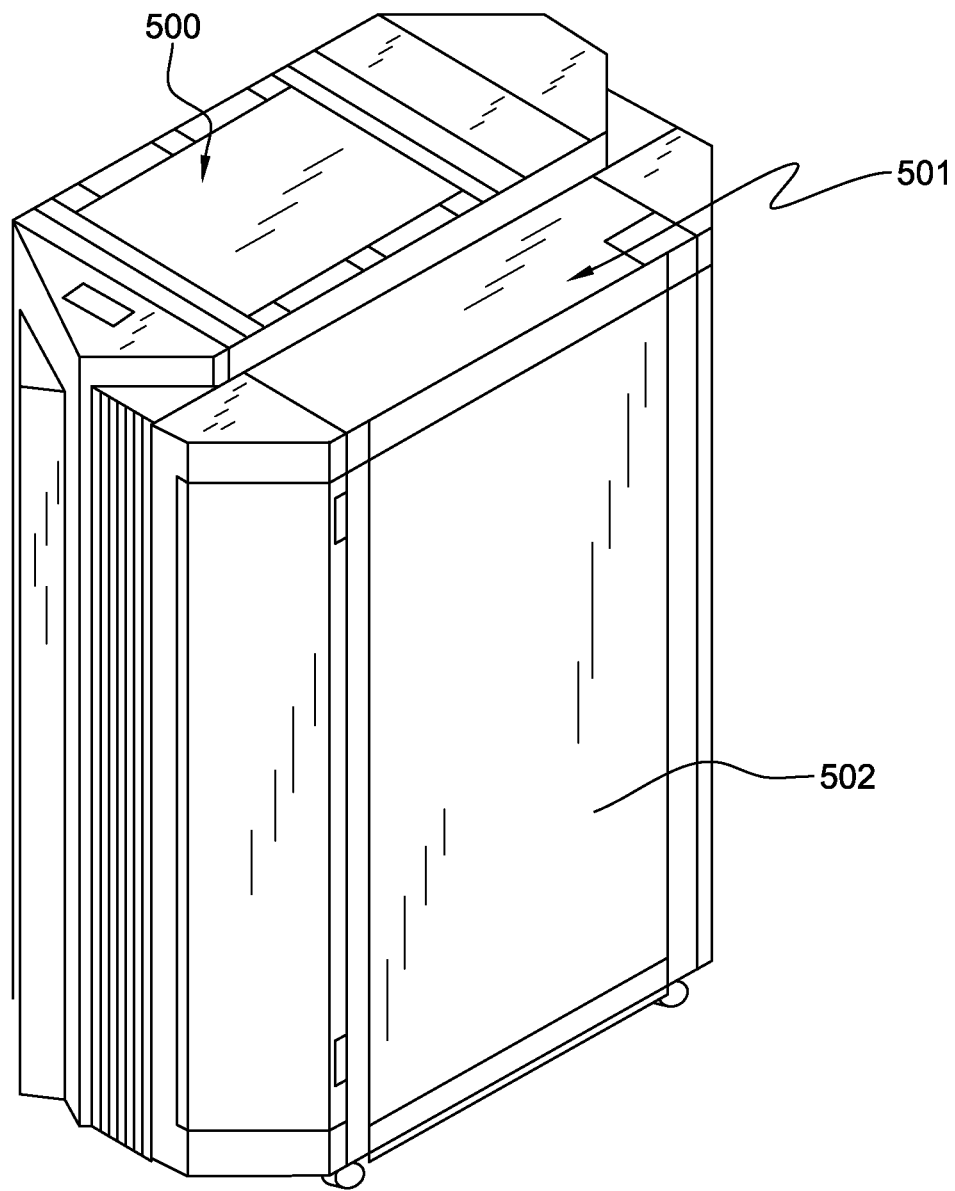
FIG. 5A is an elevational view of one embodiment of a cooled electronic system comprising an electronics rack and an airflow director configured to redirect airflow exhausting from the electronics rack at the air outlet side through an airflow return pathway back towards the air inlet side of the electronics rack, in accordance with one or more aspects of the present invention.

FIGS. 5A-7B depict in greater detail one embodiment of a cooled electronic system comprising a liquid-cooled electronics rack, such as depicted in FIG. 4, in accordance with one or more aspects of the present invention. In FIG. 5A, an electronics rack 500 is depicted surrounded by an airflow director 501 configured for the electronics rack. Airflow director 501 is configured to redirect airflow exhausting from the electronics rack at the air outlet side thereof via an airflow return pathway passing through, for example, a sidecar 502 of the airflow director, back towards the air inlet side of the electronics rack. The air-to-liquid heat exchange assembly (not shown) is disposed within the airflow return pathway defined between electronics rack 500 and airflow director 501 for cooling redirected airflow exhausting from the air outlet side of the electronics rack before returning to the air inlet side of the electronics rack. Note that in this embodiment, the airflow director and electronics rack together define the closed-loop airflow return pathway, and substantially all heat generated within the electronics rack, that is rejected to the recirculating air flow, is removed via the coolant passing through the air-to-liquid heat exchanger disposed within the airflow return pathway and the one or more coolant-cooled structures associated with the electronic subsystems.

Figure 5B:
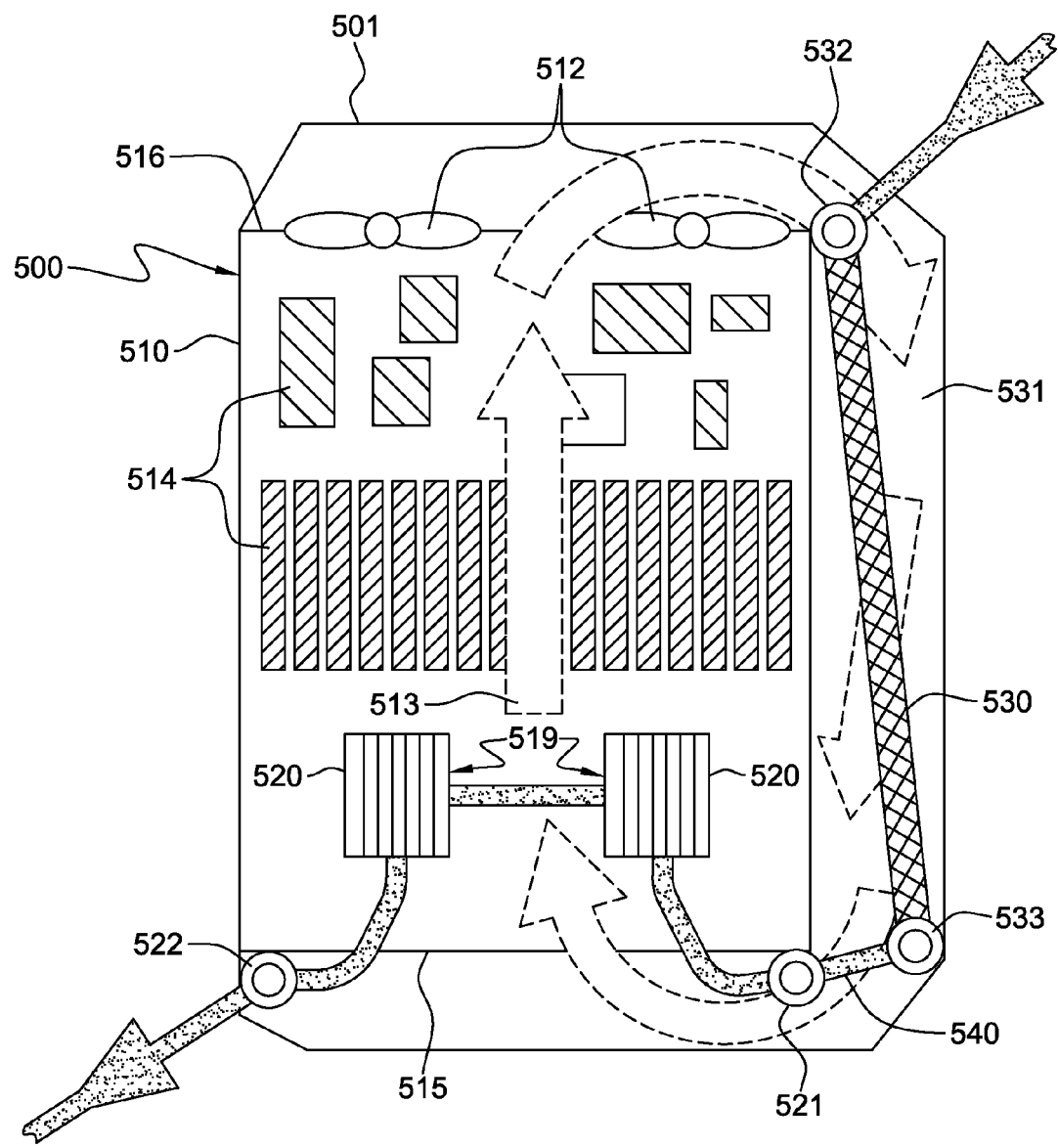
FIG. 5B is a cross-sectional plan view of one embodiment of the cooled electronic system of FIG. 5A, depicting one embodiment of a cooling apparatus for the electronics rack, and illustrating airflow within the closed loop airflow pathway through the electronics rack and airflow director, in accordance with one or more aspects of the present invention.

FIG. 5B is a cross-sectional plan view of one embodiment of the cooled electronic system depicted in FIGS. 4 & 5A. By way of example, the cooled electronic system of FIG. 5B is an economizer-based, warm-liquid-cooling system for highly efficient cooling of the electronic systems within the electronics rack using a liquid that is cooled via circulation through an outdoor air-to-liquid heat exchanger (see FIG. 4), with external ambient air being pumped through the outdoor air-to-liquid heat exchanger. FIG. 5B illustrates one embodiment of an electronic system (or subsystem) 510 component layout, wherein one or more air-moving devices 512 provide forced airflow 513 to cool multiple components 514 within electronic system 510. Cool air is taken in through a front 515 and exhausted out a back 516 of the electronic system (or drawer). The multiple components to be cooled include, for example, multiple processor modules to which a liquid-cooled structure is coupled in thermal contact. In the example depicted, the liquid-cooled structure comprises multiple liquid-cooled cold plates 520 coupled in series fluid communication between a rack-level coolant supply manifold 521 and a rack-level coolant return manifold 522.

Also depicted in FIG. 5B is an air-to-liquid heat exchanger 530 disposed within airflow return pathway 531 defined by airflow director 501 and electronics rack 500. In this embodiment, air-to-liquid heat exchanger 530 is disposed within the airflow return pathway 531 along a side of electronics rack 500 extending transverse to air inlet side 515 and air outlet side 516 thereof. The air-to-liquid heat exchanger 530 is configured and disposed within the airflow return pathway for cooling redirected airflow exhausting from the air outlet side 516 of electronics rack 500 before returning to the air inlet side 515 of electronics rack 500. A coolant supply manifold 532 and a coolant return manifold 533 are associated with air-to-liquid heat exchanger 530 for facilitating the flow of coolant through the heat exchanger. As illustrated, a coolant flow connection 540 couples in fluid communication coolant return manifold 533 and rack-level coolant supply manifold 521. Thus, in this embodiment, coolant from the coolant loop flows through coolant supply manifold 532, air-to-liquid heat exchanger 530, coolant return manifold 533, rack-level coolant supply manifold 521, one or more liquid-cooled structures 519, and thereafter, rack-level coolant return manifold 522, before returning to the outdoor air-to-liquid heat exchanger (dry cooler, not shown) for rejection of heat to, for example, external ambient air.

Those skilled in the art will note that the embodiment depicted in FIG. 5B comprises both liquid-cooled and air-cooled devices. The air heat load is cooled using an air-to-liquid heat exchanger disposed within the airflow return pathway defined by the airflow director coupled to the electronics rack. Rack-level coolant distribution includes a rack-level coolant supply manifold and a rack-level coolant return manifold, each of which comprises, a vertical plenum to which node-level flexible hoses supply and extract liquid from the liquid-cooled structures associated with the individual nodes (see, for example, FIGS. 7A-7B).

Figure 6:
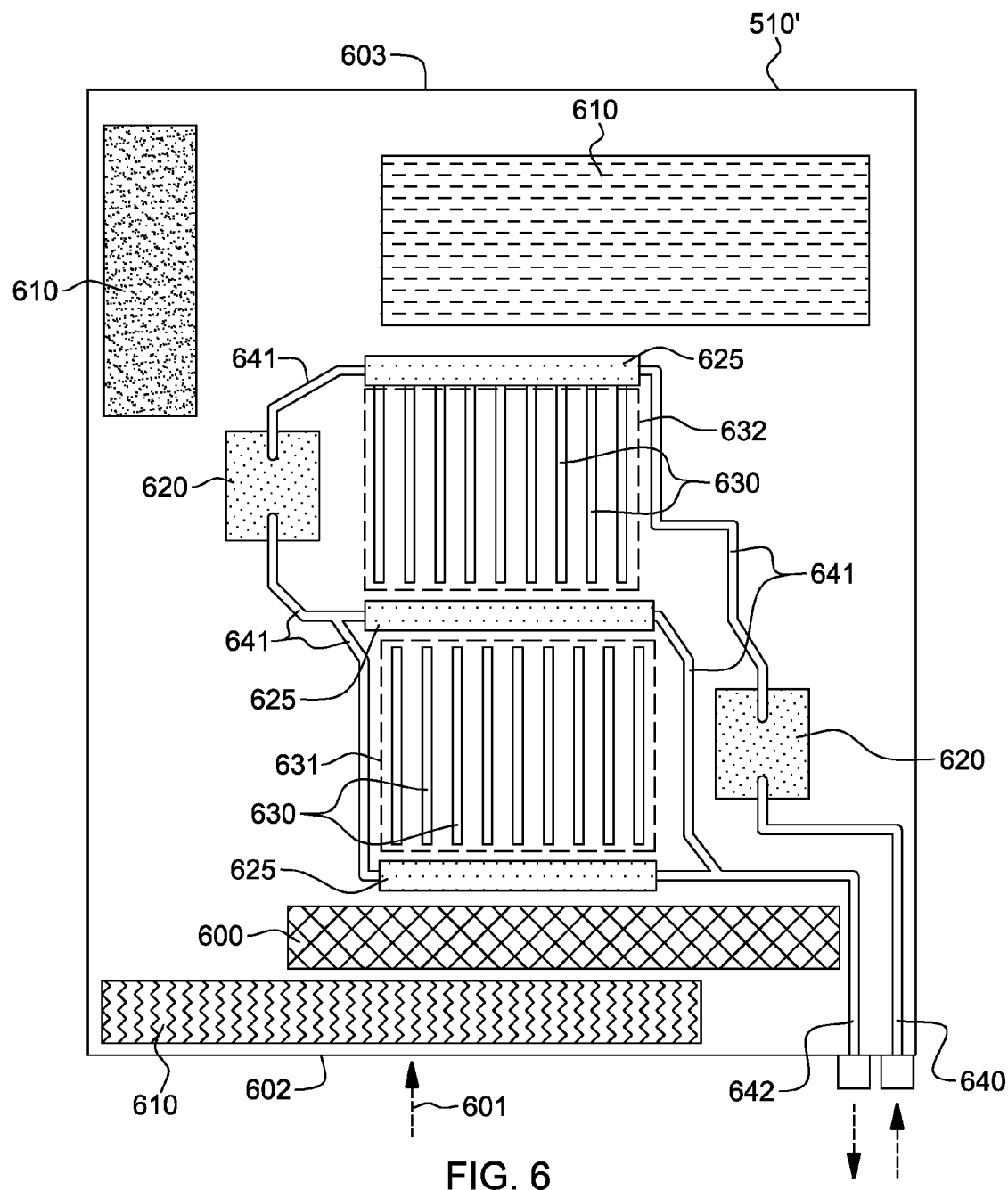
FIG. 6 is a plan view of another embodiment of an electronic system layout of an electronic subsystem with a coolant-cooled structure associated therewith comprising, for example, multiple liquid-cooled cold plates and multiple liquid-cooled cold rails coupled in fluid communication, in accordance with one or more aspects of the present invention.

FIG. 6 illustrates another embodiment of a cooled electronic system 510' component layout, wherein one or more air-moving devices 600 provide forced air flow 601 to cool multiple components 610 within electronic system 510'. Cool air is taken in through a front 602 and exhausted out a back 603 of the electronic system (or drawer). The multiple components to be cooled include, for example, multiple processor modules to which liquid-cooled cold plates 620 (of a liquid-cooled structure) are coupled, as well as multiple arrays 631, 632 of electronics cards 630 (e.g., memory modules such as dual in-line memory modules (DIMMs)), which are to be thermally coupled to one or more liquid-cooled cold rails 625 of the liquid-cooled structure associated with the electronic system. As used herein "thermally coupled" refers to a physical thermal transport path being established between components, for example, between an electronics card and a liquid-cooled cold rail for the conduction of heat from one to the other.

The illustrated liquid-based cooling approach further includes multiple coolant-carrying tubes connecting in fluid communication liquid-cooled cold plates 620 and liquid-cooled cold rails 625. These coolant-carrying tubes comprise (for example), a coolant supply tube 640, multiple bridge tubes 641, and a coolant return tube 642. In the embodiment illustrated, bridge tubes 641 connect one liquid-cooled cold rail 625 in series between the two liquid-cooled cold plates 620, and connect in parallel two additional liquid-cooled cold rails 625 between the second liquid-cooled cold plate 620 and the coolant return tube 642. Note that this configuration is provided by way of example only. The concepts disclosed herein may be readily adapted to use with various configurations of liquid-cooled structure and cooled electronic system layouts. Note also, that as depicted herein, the liquid-cooled cold rails are elongate, thermally conductive structures comprising one or more channels through which liquid coolant passes, for example, via one or more tubes extending through the structures. The liquid-cooled cold rails are disposed, in the embodiment illustrated, at the ends of the two arrays (or banks) 631, 632 of electronics cards 630, and multiple thermal spreaders are provided coupling in thermal communication electronics cards 630 and liquid-cooled cold rails 625.

As noted, FIGS. 7A & 7B depict in greater detail one embodiment of a liquid-cooled electronics rack, such as depicted in FIGS. 4-6, in accordance with one or more aspects of the present invention. In this implementation, the liquid-cooled electronics rack 700 comprises a plurality of electronic systems 710, within which one or more electronic components are to be liquid-cooled via, for example, one or more cold plates or cold rails of a liquid-cooled structure, as described below. The cooling system includes coolant loop 725 coupled in fluid communication with rack-level coolant supply manifold 720 and rack-level coolant return manifold 730, both of which may comprise vertically-oriented manifolds attached to liquid-cooled electronics rack 700. In this embodiment, the rack-level coolant distribution system further includes individual node-level supply hoses 740 supplying coolant from coolant supply manifold 720 to the cold plates and cold rails within the electronic systems 710. As shown in FIG. 7B, coolant supply manifold 740 may be (in one embodiment) a vertically-oriented manifold with a plurality of coupling connections 711 disposed along the manifold, one for each electronic system 710 having one or more electronic components to be liquid-cooled. Coolant leaves the individual electronic systems 710 via node-level return hoses 750, which couple the individual liquid-cooled structures associated with the electronic systems (or nodes) to coolant return manifold 730, and hence, to coolant loop 725. In the embodiment illustrated in FIG. 4, relatively warm-liquid coolant, such as water, is supplied from the cooling unit, either directly, or through one or more air-to-liquid heat exchanger(s) 415 (of FIG. 4), and hot coolant is returned via the coolant return manifold to the cooling unit. In one embodiment of the rack-level coolant distribution system illustrated in FIGS. 7A & 7B, the node-level supply and return hoses 740, 750 are flexible hoses.

Figure 8:
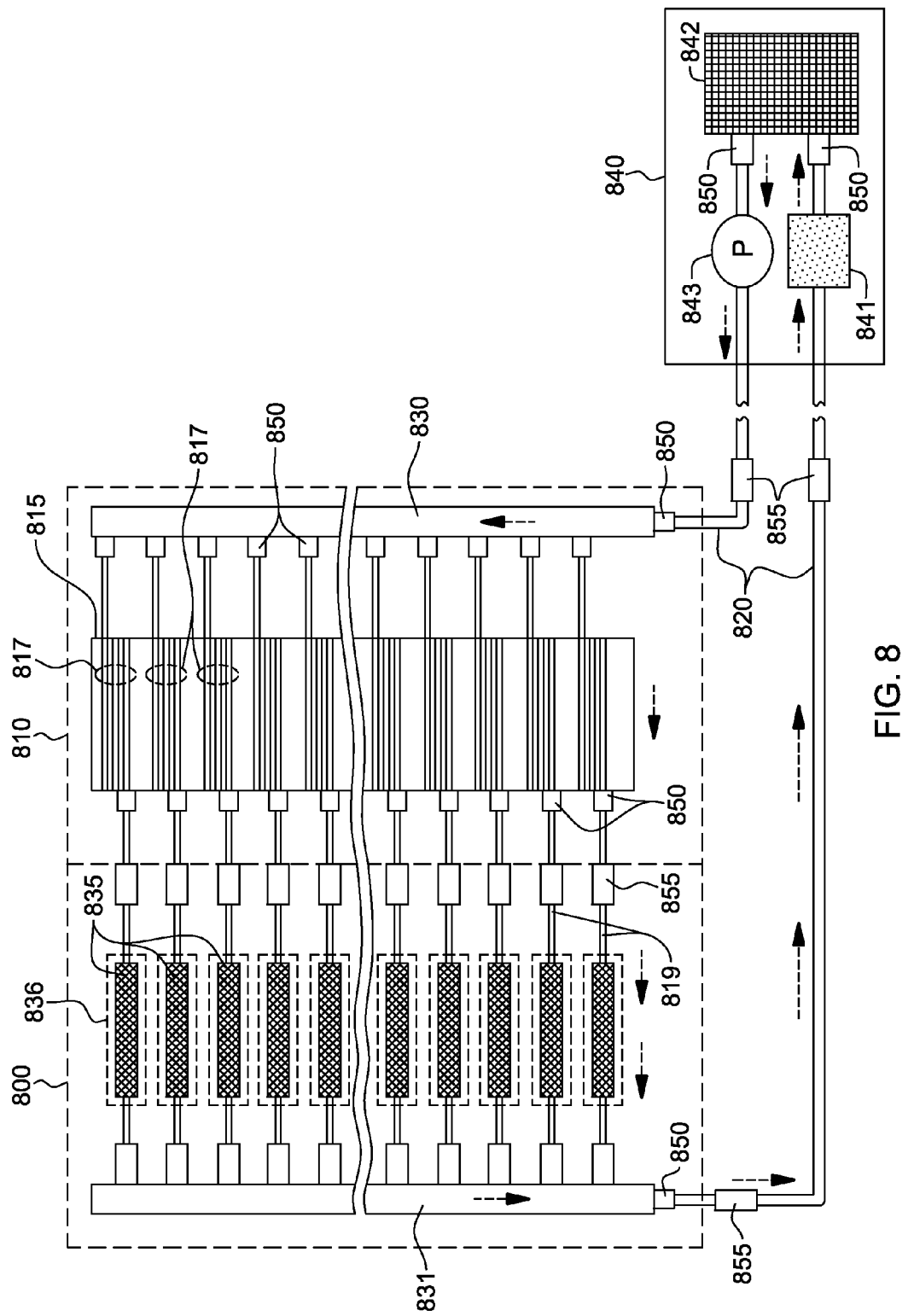
FIG. 8 depicts another embodiment of a cooled electronic system comprising a cooling apparatus and a liquid-cooled electronics rack, in accordance with one or more aspects of the present invention.
Figure 9A:
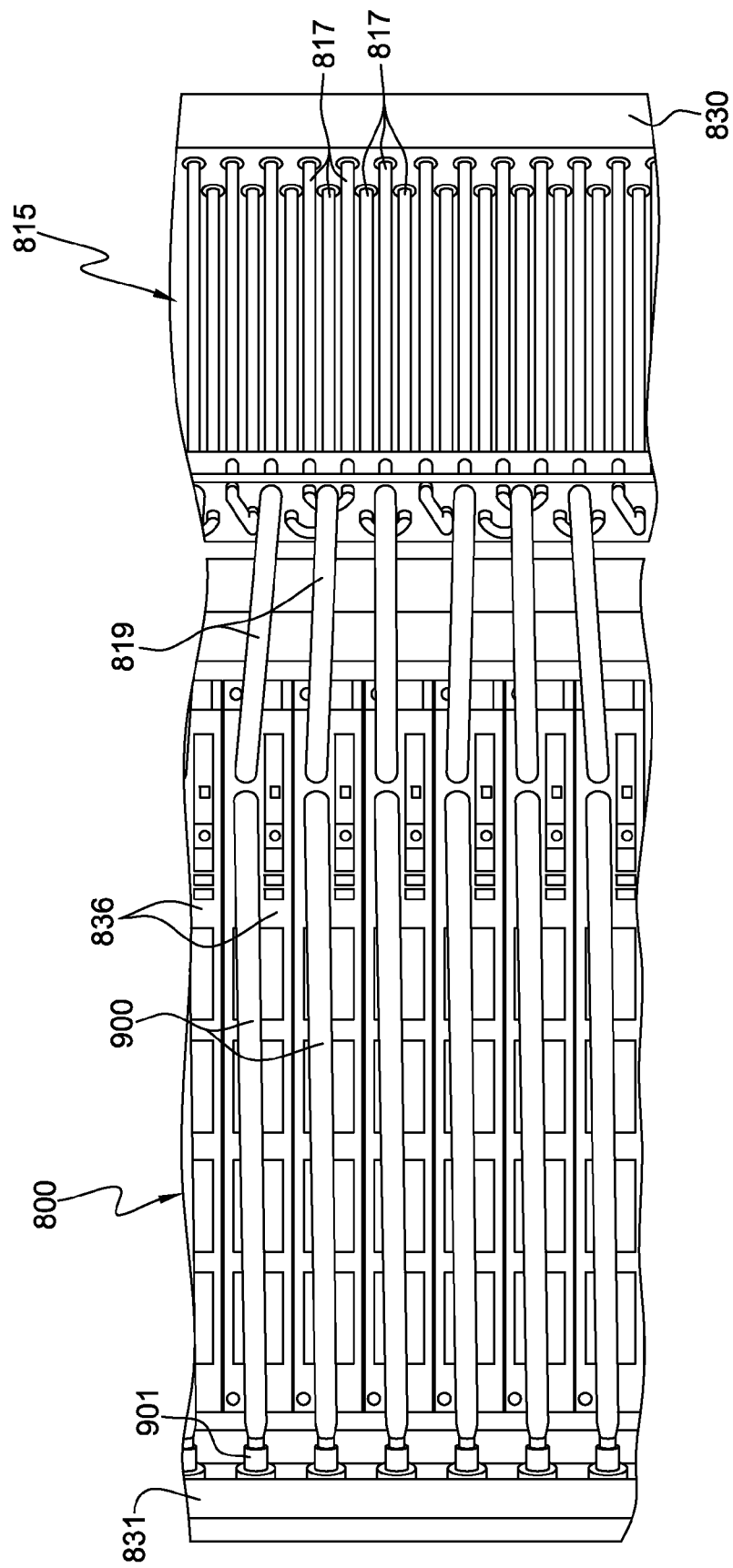
FIG. 9A is a partial, detailed elevational view of one embodiment of fluid connections between the air-to-liquid heat exchanger of the cooling apparatus and the liquid-cooled structures of the liquid-cooled electronics rack, in accordance with one or more aspects of the present invention.
Figure 9B:
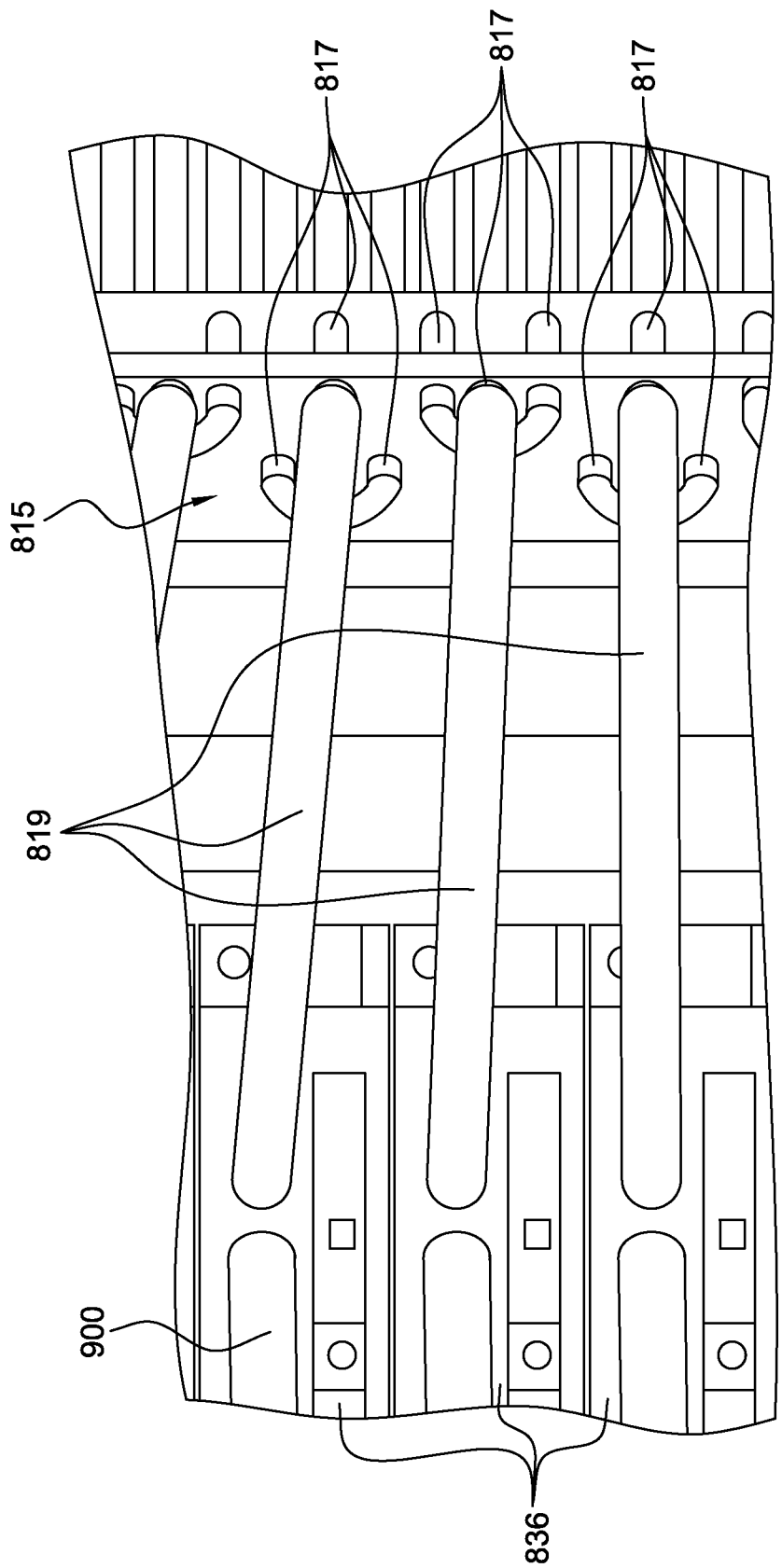
FIG. 9B is a more detailed, partial elevational view of the structures of FIG. 9A, in accordance with one or more aspects of the present invention.
Figure 10:
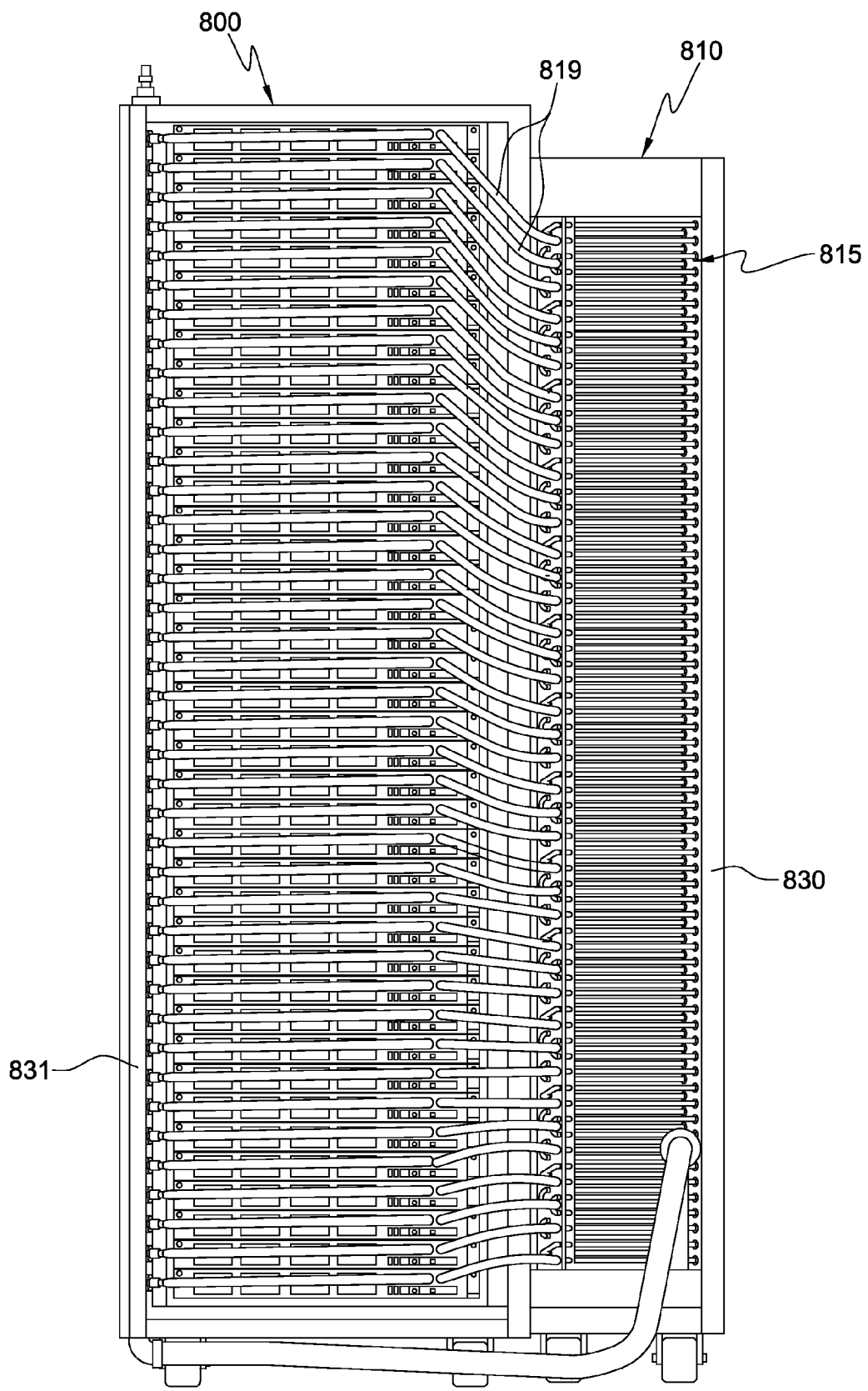
FIG. 10 is an elevational view of one embodiment of the cooled electronic system of FIGS. 8-9B, with one or more covers removed to illustrate the air-to-liquid heat exchanger and the liquid-cooled electronics rack of the cooled electronic system, in accordance with one or more aspects of the present invention.

Another embodiment of a cooled electronic system comprising a liquid-cooled electronics rack and cooling apparatus therefor, in accordance with one or more aspects of the present invention, is depicted in FIGS. 8-10. Referring collectively to these figures, in one embodiment, the electronics rack 800 has a sidecar structure 810 associated therewith (or attached thereto), which includes an air-to-liquid heat exchanger 815 through which air circulates from an air outlet side of electronics rack 800 towards an air inlet side of electronics rack 800, for example, in a closed loop path in a manner similar to that described above in connection with the cooling implementations of FIGS. 2A, 4, 5A & 5B. Note that in an alternate embodiment, the air-to-liquid heat exchanger 815 could be disposed at one or more of the air inlet side or air outlet side of the electronics rack, for example, as described above in connection with FIG. 2B.

In the example of FIGS. 8-10, the cooling apparatus (or system) comprises an economizer-based, warm-liquid coolant loop 820 connecting in fluid communication a coolant unit 840 to the cooled electronic system. In the embodiment depicted in FIG. 8, the cooled electronic system comprises a single coolant supply manifold 830 associated with air-to-liquid heat exchanger 815 and a single coolant return manifold 831 comprising a rack-level coolant return manifold associated with electronics rack 800. Also, in accordance with this embodiment of the cooled electronic system, the air-to-liquid heat exchanger 815 is divided into a plurality of distinct (e.g., separate), coolant-carrying tube sections 817, each of which may comprise a coolant inlet and a coolant outlet.

By way of example, in one embodiment, the coolant inlet of each distinct, coolant-carrying tube section 817 is coupled in fluid communication with coolant supply manifold 830 to receive coolant therethrough from coolant loop 820. The coolant outlets of each coolant-carrying tube section 817 are coupled via a respective tubing 819 in fluid communication with a liquid-cooled structure 835 disposed within or associated with a respective electronic system (or subsystem) 836. By way of example, each liquid-cooled structure 835 may comprise one or more liquid-cooled cold plates or cold rails, and have any desired component layout. By way of example, reference the layouts described above in connection with FIGS. 5B & 6. Coolant exhausted from the individual electronic systems (or nodes) 836 is returned via rack-level coolant return manifold 831 to coolant loop 820. Advantageously, in this implementation, only two coolant manifolds are employed, one associated with the air-to-liquid heat exchanger 815, and the other associated with the electronics rack 800, which advantageously saves costs in implementation. The plurality of tubes 819 may comprise a plurality of flexible hoses, and quick connects 855 or hose barb fittings 850 may be employed throughout the cooled electronic system to facilitate coupling of the various coolant lines.

Note that in the example depicted, there is a one-to-one correspondence between the number of coolant-carrying tube sections 817 within air-to-liquid heat exchanger 815 and the number of electronic systems (or subsystems) 836 or associated liquid-cooled structure 835 within electronics rack 800. This is by way of example only. In an alternate implementation, there may be (for example) less coolant-carrying tube sections 817 within the air-to-liquid heat exchanger than the number of electronic systems (or nodes) 836 or associated coolant-cooled structures 835 within the electronics rack. In such an implementation, only selected electronic systems 836 might include coolant-cooled structures 835 coupled to receive coolant from the air-to-liquid heat exchanger, with the remaining systems being air-cooled, as explained herein.

As illustrated, coolant flowing through warm-liquid coolant loop 820, after passing through the respective distinct, coolant-carrying tube sections 817, flows via tubing 819 to one or more electronic systems 836 of electronics rack 800, and in particular, to one or more coolant-cooled structures 835 associated with the electronic systems 836, before returning via rack-level coolant return manifold 831 to warm-liquid coolant loop 820, and subsequently, to cooling unit 840 disposed (for example) outdoors from the data center. In the embodiment illustrated, cooling unit 840 includes a filter 841 for filtering the circulating liquid coolant, an air-to-liquid heat exchanger 842 for removing heat from the liquid coolant, and a pump 843 for returning the liquid coolant through warm-liquid coolant loop 820 to coolant supply manifold 830 for again passing through the plurality of distinct, coolant-carrying tube sections 817 of air-to-liquid heat exchanger 815, and subsequently, to the coolant-cooled structures 835 of the liquid-cooled electronics rack 800. As noted, and by way of example only, hose barb fittings 850 and quick connect couplings 855 may be employed to facilitate assembly or disassembly of warm-liquid coolant loop 820.

As with the embodiment of FIG. 4, in one example of the warm coolant-cooling approach of FIG. 8, ambient temperature might be 30° C., and coolant temperature 35° C., leaving the air-to-liquid heat exchanger 842 of the cooling unit 840. The cooled electronic system depicted thus facilitates a chiller-less data center. Advantageously, such a liquid-cooling solution provides highly energy efficient cooling of the electronic systems of the electronics rack using liquid (e.g., water), that is cooled via circulation through the air-to-liquid heat exchanger located outdoors (i.e., a dry cooler) with external ambient air being pumped through the dry cooler. Note that this warm-coolant-cooling approach of FIG. 8 is presented by way of example only. In alternate approaches, cooled-coolant-cooling could be substituted for the cooling unit 840 depicted in FIG. 8. Such cold-coolant-cooling might employ building-chilled facility coolant to cool the liquid coolant flowing through the liquid-cooled electronics rack, and associated air-to-liquid heat exchanger in a manner such as described above in connection with FIGS. 2A-3.

Note further that in the embodiment depicted in FIGS. 8-10, the air-to-liquid heat exchanger comprises a plurality of distinct, coolant-carrying tube sections 817. These coolant-carrying tube sections 817 may take any configuration. For example, each coolant-carrying tube section 817 may be a discrete, sinusoidal-shaped structure having a coolant inlet and a coolant outlet. The coolant inlets may be coupled (in one example) to the coolant supply manifold 830 associated with the air-to-liquid heat exchanger. In an alternate implementation, however, the coolant inlets could be coupled via tubings 819 to the coolant-cooled structures 835 associated with the electronic systems (or nodes) 836 of electronics rack 800. Note that the concepts disclosed herein are not dependent on the direction of coolant flow through the cooled electronic system. In one implementation, hose barb fittings and quick connect couplings are employed to facilitate assembly or disassembly of the warm-liquid coolant loop, including the connections for tubings 819 and flexible hoses 900 (FIGS. 9A-10), described below. For example, one end of tubing 819 may comprise a hose barb fitting 850 and the other end a quick disconnect coupling 855 for coupling either to the coolant outlets of the coolant-carrying tube sections 817 of the air-to-liquid heat exchanger or to the coolant inlet of a respective coolant-cooled structure 835 associated with an electronic system (or node) 836 of electronics rack 800.

FIGS. 9A-10 depict in greater detail one embodiment of a cooled electronic system such as described above in connection with FIG. 8.

As illustrated in FIG. 9A, a plurality of coupling connections 901 may be provided along rack-level coolant return manifold 831 to facilitate coupling of coolant exhaust hoses 900 to the return manifold. The coolant supply manifold 830 is depicted integrated within the air-to-liquid heat exchanger in FIGS. 9A & 10, and the coolant return manifold 831 is disposed within electronics rack 800. By providing an air-to-liquid heat exchanger 815 with multiple discrete coolant-carrying tube sections 817, each with a coolant inlet and a coolant outlet, the air-to-liquid heat exchanger 815 and coolant-cooled structures associated with the electronic systems 836 may be coupled in series fluid communication as depicted, by way of example, in FIG. 8. The distinct coolant-carrying tube sections 817 may (in one embodiment) each terminate at their coolant outlet in either a quick disconnect coupler or a hose barb fitting to facilitate coupling of the flexible tubing 819 to the individual coolant-carrying tube sections of the heat exchanger. In one implementation, the flexible tubes 819 are each connected to one liquid-cooled node to supply coolant to cool the coolant-cooled structure associated that one node. After cooling the liquid-cooled structures within the node, the coolant exits from the node via the coolant exhaust hose 900 to the rack-level coolant return manifold 831.

Advantageously, employing a cooling apparatus such as depicted in FIGS. 8-10 reduces the number of coolant manifolds required within the cooled electronic system. Further, the number of coolant-carrying tube sections can be readily adjusted to correspond, for example, to the number of electronic systems (or nodes) 836 within the electronics rack, or more particularly, to correspond with the number of liquid-cooled structures 835 to be associated with the electronic systems 836 for facilitating liquid-cooling of one or more electronic components within those nodes. For example, in an electronics rack 800 comprising 42 electronic systems (or nodes), the heat exchanger may be configured to include 42 distinct, coolant-carrying tube sections, each of which has its own coolant inlet and coolant outlet.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A cooling apparatus for an electronics rack, the cooling apparatus comprising:
   an air-to-liquid heat exchanger associated with the electronics rack and disposed to cool at least a portion of air passing through the electronics rack, wherein air moves through the electronics rack from an air inlet side to an air outlet side thereof, and the air-to-liquid heat exchanger comprises a plurality of distinct, coolant-carrying tube sections, each coolant-carrying tube section of the plurality of distinct, coolant-carrying tube sections comprising a coolant inlet and a coolant outlet, at least one of the coolant inlet or the coolant outlet of one coolant-carrying tube section being coupled in fluid communication with a coolant loop to facilitate flow of coolant through the one coolant-carrying tube section;
   at least one coolant-cooled structure in thermal contact with at least one electronic component of the electronics rack, the at least one coolant-cooled structure facilitating transfer of heat from the at least one electronic component to the coolant; and
   a tube connecting in fluid communication one coolant-cooled structure of the at least one coolant-cooled structure, and the other of the coolant inlet or the coolant outlet of the one coolant-carrying tube section of the plurality of distinct, coolant-carrying tube sections of the air-to-liquid heat exchanger, the tube facilitating flow of coolant directly between the one coolant-carrying tube section of the air-to-liquid heat exchanger and the one coolant-cooled structure of the at least one coolant-cooled structure.

2. The cooling apparatus of claim 1, wherein the tube is connected so that all coolant to pass through the one coolant-carrying tube section of the plurality of distinct, coolant-carrying tube sections of the air-to-liquid heat exchanger also passes through the one coolant-cooled structure of the at least one coolant-cooled structure.

3. The cooling apparatus of claim 1, wherein the coolant inlet of the one coolant-carrying tube section of the plurality of distinct, coolant-carrying tube sections is coupled in fluid communication with the coolant loop across a coolant supply manifold associated with the air-to-liquid heat exchanger and the coolant outlet of the one coolant-carrying tube section of the plurality of distinct, coolant-carrying tube sections is connected via the tube to a fluid inlet of the one coolant-cooled structure of the at least one coolant-cooled structure.

4. The cooling apparatus of claim 3, wherein a fluid outlet of the one coolant-cooled structure of the at least one coolant-cooled structure is coupled in fluid communication with the coolant loop across a coolant return manifold associated with the electronics rack.

5. The cooling apparatus of claim 1, further comprising:
an airflow director configured for the electronics rack, wherein the airflow director is configured to redirect airflow exhausting from the electronics rack at the air outlet side thereof via an airflow return pathway back towards the air inlet side of the electronics rack, and wherein the air-to-liquid heat exchanger is disposed within the airflow return pathway for cooling redirected airflow exhausting from the air outlet side of the electronics rack before returning to the air inlet side of the electronics rack.

6. The cooling apparatus of claim 5, wherein the air-to-liquid heat exchanger is disposed within the airflow return pathway along a side of the electronics rack extending transverse to the air inlet side and the air outlet side thereof.

7. The cooling apparatus of claim 1, wherein the air-to-liquid heat exchanger is coupled to the electronics rack at the air outlet side of the electronics rack.

8. The cooling apparatus of claim 1, wherein the electronics rack comprises a plurality of electronic subsystems, and the cooling apparatus comprises a plurality of coolant-cooled structures, at least some electronic subsystems each having a respective coolant-cooled structure of the plurality of coolant-cooled structures associated therewith, and wherein the cooling apparatus further comprises a plurality of tubes, each tube connecting in fluid communication one coolant-carrying tube section of the plurality of distinct, coolant-carrying tube sections of the air-to-liquid heat exchanger and the coolant-cooled structure associated with an electronic subsystem of the at least some electronic subsystems of the electronics rack to facilitate direct flow of coolant between the coolant-carrying tube section of the air-to-liquid heat exchanger and the coolant-cooled structure of the respective electronic subsystem absent any coolant manifold being between the coolant-carrying tube section of the air-to-liquid heat exchanger and the coolant-cooled structure of the respective electronic subsystem.

9. The cooling apparatus of claim 8, wherein the coolant inlet of each coolant-carrying tube section of the plurality of distinct, coolant-carrying tube sections is coupled in fluid communication with the coolant loop across a coolant supply manifold associated with the air-to-liquid heat exchanger, and the coolant outlet of each coolant-carrying tube section of the plurality of distinct, coolant-carrying tube sections is connected in fluid communication with the coolant-cooled structure associated with a respective electronic subsystem of the at least some electronic subsystems, and wherein fluid outlets of the coolant-cooled structures associated with the at least some electronic subsystems are coupled in fluid communication with the coolant loop across a coolant return manifold associated with the electronics rack.

10. The cooling apparatus of claim 9, wherein the plurality of distinct, coolant-carrying tube sections of the air-to-liquid heat exchanger comprise N distinct, coolant-carrying tube sections and the at least some electronic subsystems of the electronics rack comprise N electronic subsystems.

11. A cooled electronic system comprising:
an electronics rack comprising an air inlet side and an air outlet side for respectively enabling ingress and egress of air through the electronics rack, the electronics rack further comprising at least one electronic component to be cooled; and
a cooling, apparatus facilitating cooling of the electronics rack, the cooling apparatus comprising:
an air-to-liquid heat exchanger associated with the electronics rack and disposed to cool at least a portion of air passing through the electronics rack, the air-to-liquid heat exchanger comprising a plurality of distinct, coolant-carrying tube sections, each coolant-carrying tube section of the plurality of distinct, coolant-carrying tube sections comprising a coolant inlet and a coolant outlet, one of the coolant inlet or the coolant outlet being coupled in fluid communication with a coolant loop to facilitate flow of coolant through the one coolant-carrying tube section;
at least one coolant-cooled structure in thermal contact with an electronic component of the at least one electronic component of the electronics rack, the at least one coolant-cooled structure facilitating transfer of heat from the electronic component to the coolant; and
a tube connecting in fluid communication one coolant-cooled structure of the at least one coolant-cooled structure and the other of the coolant inlet or the coolant outlet of the one coolant-carrying tube section of the plurality of distinct, coolant-carrying tube sections of the air-to-liquid heat exchanger, the tube facilitating flow of coolant directly between the one coolant-carrying tube section of the air-to-liquid heat exchanger and the one coolant-cooled structure of the at least one coolant-cooled structure.

12. The cooled electronic system of claim 11, wherein the tube is connected so that all coolant to pass through the one coolant-carrying tube section of the plurality of distinct, coolant-carrying tube sections of the air-to-liquid heat exchanger also passes through the one coolant-cooled structure of the at least one coolant-cooled structure.

13. The cooled electronic system of claim 11, wherein the coolant inlet of the one coolant-carrying tube section of the plurality of distinct, coolant-carrying tube sections is coupled in fluid communication with the coolant loop across a coolant supply manifold associated with the air-to-liquid heat exchanger and the coolant outlet of the one coolant-carrying tube section of the plurality of distinct, coolant-carrying tube sections is connected via the tube to a fluid inlet of the one coolant-cooled structure of the at least one coolant-cooled structure, and wherein a fluid outlet of the one coolant-cooled structure of the at least one coolant-cooled structure is coupled in fluid communication with the coolant loop across a coolant return manifold associated with the electronics rack.

14. The cooled electronic system of claim 11, further comprising:
an airflow director configured for the electronics rack, wherein the airflow director is configured to redirect airflow exhausting from the electronics rack at the air outlet side thereof via an airflow return pathway back towards the air inlet side of the electronics rack, and wherein the air-to-liquid heat exchanger is disposed within the airflow return pathway for cooling redirected airflow exhausting from the air outlet side of the electronics rack before returning to the air inlet side of the electronics rack.

15. The cooled electronic system of claim 14, wherein the air-to-liquid heat exchanger is disposed within the airflow return pathway along a side of the electronics rack extending transverse to the air inlet side and the air outlet side thereof.

16. The cooled electronic system of claim 11, wherein the air-to-liquid heat exchanger is coupled to the electronics rack at the air outlet side of the electronics rack.

17. The cooled electronic system of claim 11, wherein the electronics rack comprises a plurality of electronic subsystems, and the cooling apparatus comprises a plurality of coolant-cooled structures, at least some electronic subsystems each having a respective coolant-cooled structure of the plurality of coolant-cooled structures associated therewith, and wherein the cooling apparatus further comprises a plurality of tubes, each tube connecting in fluid communication one coolant-carrying tube section of the plurality of distinct, coolant-carrying tube sections of the air-to-liquid heat exchanger and the coolant-cooled structure associated with an electronic subsystem of the at least some electronic subsystems of the electronics rack to facilitate direct flow of coolant between the coolant-carrying tube section of the air-to-liquid heat exchanger and the coolant-cooled structure of the respective electronic subsystem absent any coolant manifold being between the coolant-carrying tube section of the air-to-liquid heat exchanger and the coolant-cooled structure of the respective electronic subsystem.

18. The cooled electronic system of claim 17, wherein the coolant inlet of each coolant-carrying tube section of the plurality of distinct, coolant-carrying tube sections is coupled in fluid communication with the coolant loop across a coolant supply manifold associated with the air-to-liquid heat exchanger, and the coolant outlet of each coolant-carrying tube section of the plurality of distinct, coolant-carrying tube sections is connected in fluid communication with the coolant-cooled structure associated with a respective electronic subsystem of the at least some electronic subsystems, and wherein fluid outlets of the coolant-cooled structures associated with the at least some electronic subsystems are coupled in fluid communication with the coolant loop across a coolant return manifold associated with the electronics rack.

* * * * *